United States Patent
Tateyama et al.

(10) Patent No.: US 12,027,405 B2
(45) Date of Patent: Jul. 2, 2024

(54) SEMICONDUCTIVE CERAMIC MEMBER

(71) Applicant: KYOCERA Corporation, Kyoto (JP)

(72) Inventors: Yasuharu Tateyama, Kirishima (JP); Yoshinori Hirano, Kirishima (JP); Naoya Fujita, Kirishima (JP); Senri Tsujitake, Kirishima (JP); Shoji Kohsaka, Kirishima (JP)

(73) Assignee: Kyocera Corporation, Kyoto (JP)

( * ) Notice: Subject to any disclaimer, the term of this patent is extended or adjusted under 35 U.S.C. 154(b) by 626 days.

(21) Appl. No.: 17/279,203

(22) PCT Filed: Sep. 24, 2019

(86) PCT No.: PCT/JP2019/037299
§ 371 (c)(1),
(2) Date: Mar. 24, 2021

(87) PCT Pub. No.: WO2020/071178
PCT Pub. Date: Apr. 9, 2020

(65) Prior Publication Data
US 2022/0020626 A1 Jan. 20, 2022

(30) Foreign Application Priority Data
Oct. 2, 2018 (JP) .................................. 2018-187535

(51) Int. Cl.
*H01L 21/683* (2006.01)
*C04B 35/119* (2006.01)
*G01N 23/2273* (2018.01)

(52) U.S. Cl.
CPC .......... *H01L 21/683* (2013.01); *C04B 35/119* (2013.01); *G01N 23/2273* (2013.01)

(58) Field of Classification Search
None
See application file for complete search history.

(56) References Cited

U.S. PATENT DOCUMENTS

| 6,641,939 B1 * | 11/2003 | Lee ......................... C04B 35/64 428/210 |
| 2012/0218054 A1 * | 8/2012 | Toyoda ................. C04B 35/465 333/186 |

FOREIGN PATENT DOCUMENTS

JP 2007-091488 A 4/2007

* cited by examiner

*Primary Examiner* — Samir Shah
(74) *Attorney, Agent, or Firm* — Procopio, Cory, Hargreaves & Savitch LLP

(57) ABSTRACT

A semiconductive ceramic member according to the present disclosure contains a plurality of aluminum oxide crystal grains, and a plurality of titanium oxide crystal grains. The total content of aluminum oxide and titanium oxide is 99% by mass or more per 100% by mass of all constituents. The content of the aluminum oxide is 86% by mass or more and 96% by mass or less and the content of the titanium oxide is 4% by mass or more and 14% by mass or less per 100% by mass of the aluminum oxide and the titanium oxide in total. A peak of $TiO_x$ ($0<x<2$) is present within a binding energy range of 456 eV to 462 eV (both inclusive) in X-ray photoelectron spectroscopy measurement. The semiconductive ceramic member further contains silicon, and the content of the silicon in terms of its oxide in a first region is larger than the content of the silicon in terms of its oxide in a grain boundary.

6 Claims, 4 Drawing Sheets

SEMICONDUCTIVE CERAMIC MEMBER

FIELD

The present invention relates to a semiconductive ceramic member.

BACKGROUND

A semiconductive ceramic member is used for holding and conveyance of a wafer in, for example, exposure equipment. The semiconductive ceramic member has high mechanical strength and, in addition, low electrical resistance to enable dissipation of static electricity for preventing, for example, dust and airborne particulate matter from electrostatically adhering to the wafer.

For example, alumina ceramics that is predominantly composed of aluminum oxide ($Al_2O_3$) and contains titanium oxide ($TiO_2$) is known as such a semiconductive ceramic member. Such alumina ceramics becomes electrically conductive when fired in a reducing atmosphere (e.g., refer to Patent Literature 1).

CITATION LIST

Patent Literature

Patent Literature 1: JP 2007-091488 A

SUMMARY

A semiconductive ceramic member according to the present disclosure includes: a plurality of aluminum oxide crystal grains; and a plurality of titanium oxide crystal grains. A total content of aluminum oxide and titanium oxide is 99% by mass or more per 100% by mass of all constituents. A content of the aluminum oxide is 86% by mass or more and 96% by mass or less and a content of the titanium oxide is 4% by mass or more and 14% by mass or less per 100% by mass of the aluminum oxide and the titanium oxide in total. A peak of $TiO_x$ ($0<x<2$) is present within a binding energy range of 456 eV to 462 eV in X-ray photoelectron spectroscopy measurement. The semiconductive ceramic member further comprises silicon. A content of the silicon in terms of its oxide in a first region surrounded by two of the aluminum oxide crystal grains and one of the titanium oxide crystal grains is larger than a content of the silicon in terms of its oxide in a grain boundary between the aluminum oxide crystal grains and the titanium oxide crystal grains.

DESCRIPTION OF EMBODIMENTS

A semiconductive ceramic member according to the present disclosure will be described in detail below with reference to the drawings.

Figure 1:
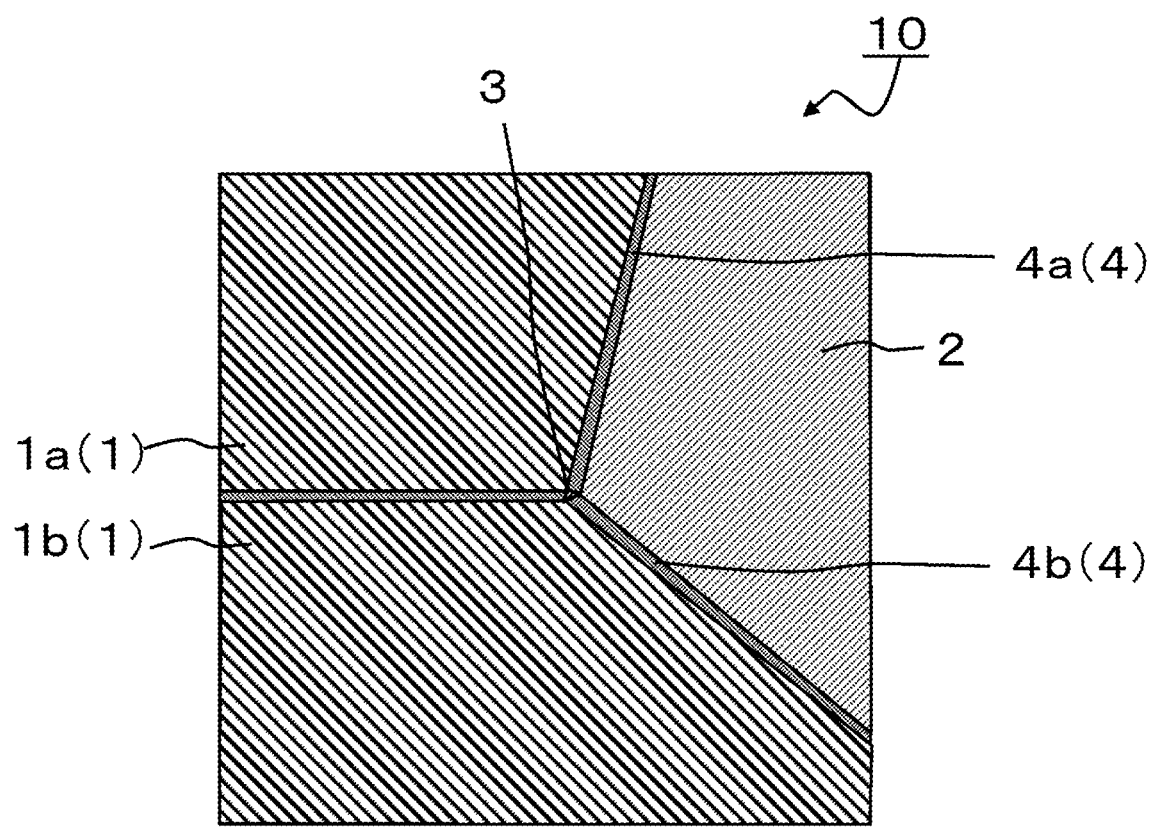
FIG. 1 is an example of an enlarged view of a section of a semiconductive ceramic member according to the present disclosure.

A semiconductive ceramic member 10 according to the present disclosure contains a plurality of aluminum oxide crystal grains 1 and a plurality of titanium oxide crystal grains 2. FIG. 1 is an example of an enlarged view of a section of the semiconductive ceramic member 10 and illustrates two aluminum oxide crystal grains 1, one titanium oxide crystal grain 2, a first region 3 surrounded by these crystal grains, and a grain boundary 4 between the crystal grains.

In the semiconductive ceramic member 10 according to the present disclosure, the total content of aluminum oxide and titanium oxide is 99% by mass or more per 100% by mass of all the constituents constituting the semiconductive ceramic member 10. Such a configuration allows the semiconductive ceramic member 10 according to the present disclosure to have high mechanical strength.

The content of aluminum oxide is 86% by mass or more and 96% by mass or less and the content of titanium oxide is 4% by mass or more and 14% by mass or less per 100% by mass of aluminum oxide and titanium oxide in total.

Figure 2:
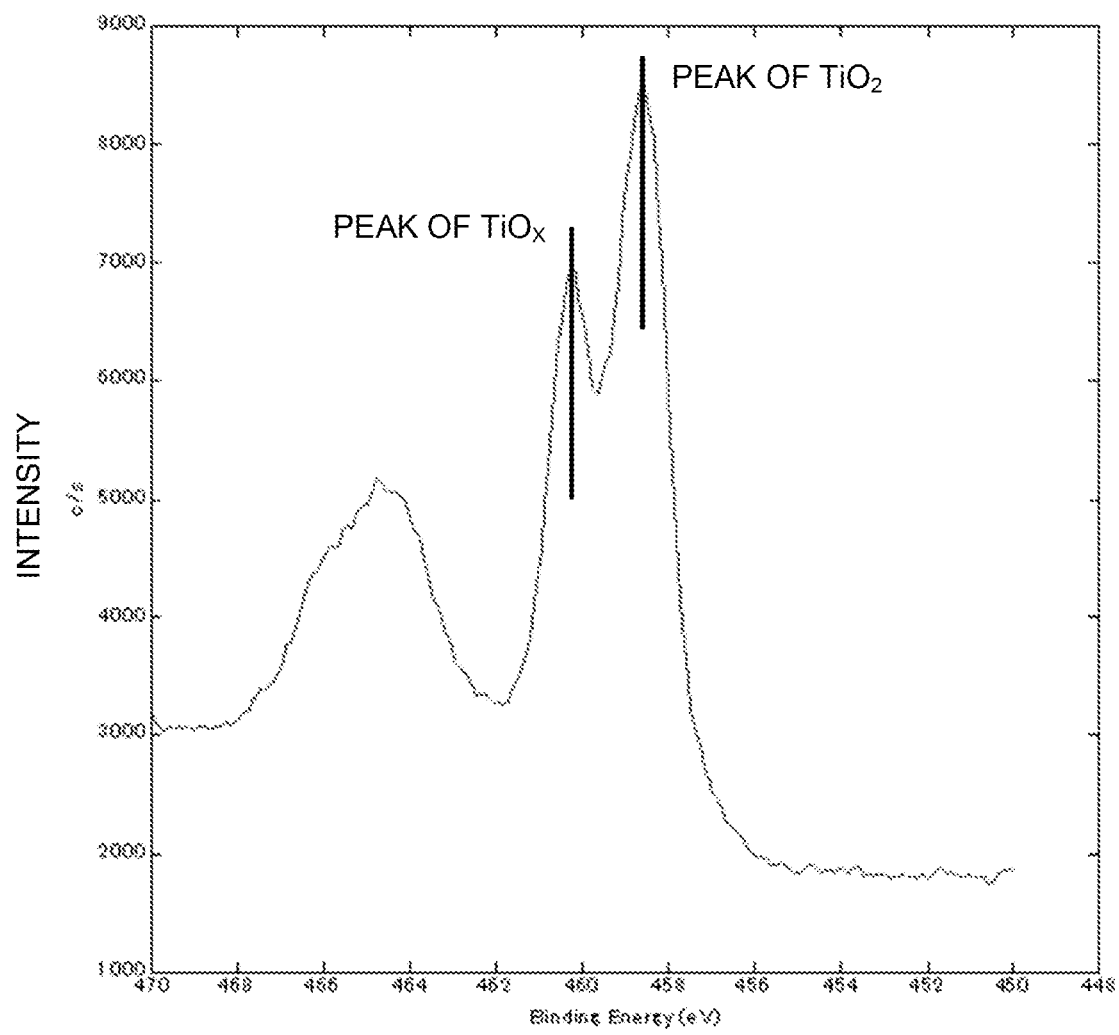
FIG. 2 is an example of an X-ray photoelectron spectroscopy (XPS) chart for the semiconductive ceramic member according to the present disclosure.
Figure 3:
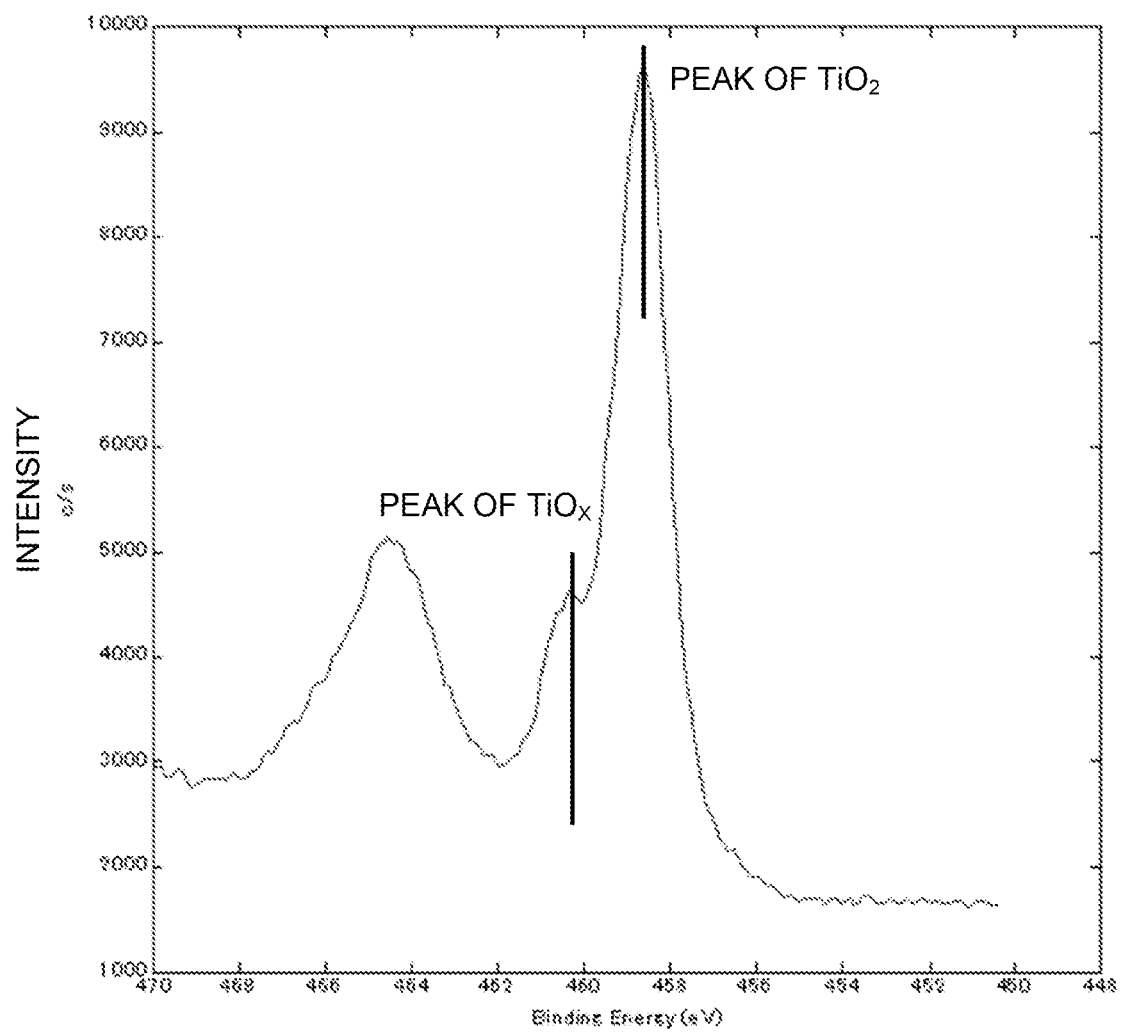
FIG. 3 is another example of the XPS chart for the semiconductive ceramic member according to the present disclosure.
Figure 4:
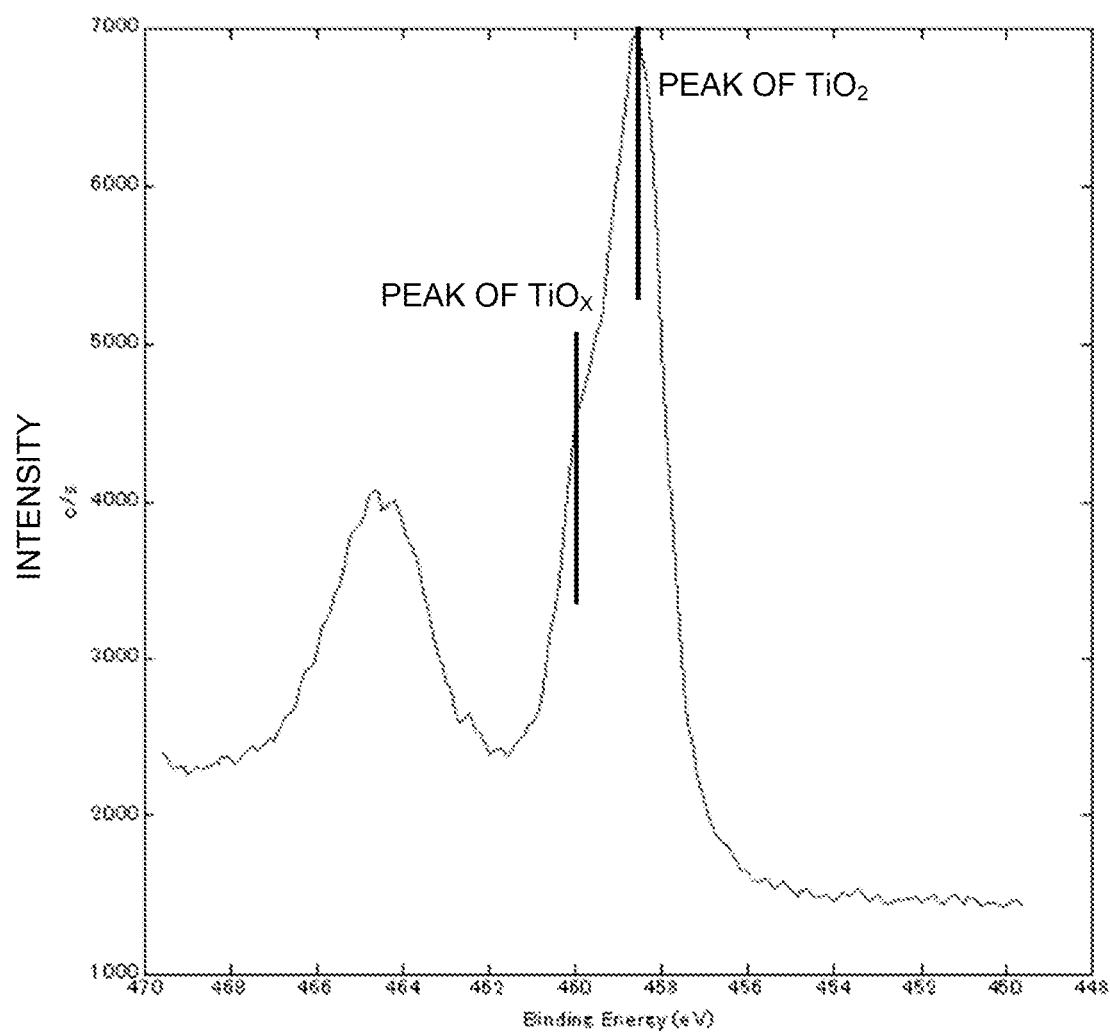
FIG. 4 is still another example of the XPS chart for the semiconductive ceramic member according to the present disclosure.

As illustrated in FIGS. 2 to 4, the semiconductive ceramic member 10 according to the present disclosure has a peak of $TiO_x$ ($0<x<2$) within a binding energy range of 456 eV to 462 eV in X-ray photoelectron spectroscopy (XPS) measurement.

$TiO_x$ ($0<x<2$) refers to $TiO_2$ in an oxygen-deficient state. $TiO_x$ ($0<x<2$) and $TiO_2$ may coexist due to the presence of some $TiO_2$ not being oxygen-deficient. In this case, the peak of $TiO_2$ is present within the binding energy range of 456 eV to 462 eV, whereas the peak of $TiO_x$ ($0<x<2$) is located at a high energy side relative to the peak of $TiO_2$. Specifically, in FIGS. 2 to 4, the horizontal axis represents the binding energy (eV) and the vertical axis represents photoemissive intensity (c/s; counts per second). The peak of $TiO_2$ appears at a binding energy of approximately 458.6 eV, whereas the peak of $TiO_x$ ($0<x<2$) appears at a binding energy of approximately 459.8 eV.

Thus, such a configuration allows the semiconductive ceramic member 10 according to the present disclosure to have low electrical resistance. The low electrical resistance means that the volume resistivity is $10^3$ Ω·cm or more and $10^{10}$ Ω·cm or less.

The volume resistivity may be determined by performing measurement using the three-terminal method on the semiconductive ceramic member 10 cut into a shape in conformity with JIS C 2141 (1992). For example, ultrahigh insulation resistance meter 8340A manufactured by ADC CORPORATION can be used in the measurement using the three-terminal method.

If the total content of aluminum oxide and titanium oxide is 99% by mass or more per 100% by mass of all the constituents constituting the semiconductive ceramic member 10, and the content of aluminum oxide is less than 86% by mass per 100% by mass of aluminum oxide and titanium oxide in total, the volume resistivity may become less than $10^3$ Ω·cm. On the other hand, if the total content of aluminum oxide and titanium oxide is 99% by mass or more per 100% by mass of all the constituents constituting the semiconductive ceramic member 10, and the content of aluminum oxide is more than 96% by mass per 100% by mass of aluminum oxide and titanium oxide in total, the volume resistivity may become more than $10^{10}$ Ω·cm.

If the total content of aluminum oxide and titanium oxide is 99% by mass or more per 100% by mass of all the constituents constituting the semiconductive ceramic member 10, and the content of titanium oxide is less than 4% by mass per 100% by mass of aluminum oxide and titanium oxide in total, the volume resistivity may become more than $10^{10}$ Ω·cm. On the other hand, if the total content of aluminum oxide and titanium oxide is 99% by mass or more per 100% by mass of all the constituents constituting the semiconductive ceramic member 10, and the content of titanium oxide is more than 14% by mass per 100% by mass of aluminum oxide and titanium oxide in total, the volume resistivity may become less than $10^3$ Ω·cm.

If the peak of $TiO_x$ (0<x<2) is not present within the binding energy range of 456 eV to 462 eV, the electrical resistance may increase and exceed $10^{10}$ Ω·cm. The presence of the peak of $TiO_x$ (0<x<2) means not only that $TiO_x$ (0<x<2) has a definite peak as illustrated in FIGS. 2 and 3, but also that $TiO_x$ (0<x<2) has a broad peak at the high binding energy side relative to the peak of the $TiO_2$ as illustrated in FIG. 4.

The content of each constituent of the semiconductive ceramic member 10 according to the present disclosure can be determined by obtaining the content of each element by performing measurement using an X-ray fluorescence spectrometer (XRF) or an inductively coupled plasma atomic emission spectrometer (ICP-AES) and then converting the obtained element content into the content of corresponding oxide. Specifically, the content of Al may be obtained by measurement using the XRF or ICP-AES, and the obtained content may be converted into the content of $Al_2O_3$. Also, the content of Ti may be obtained by measurement using the XRF or ICP-AES, and the obtained content may be converted into the content of $TiO_2$.

Whether the total content of aluminum oxide and titanium oxide is 99% by mass or more per 100% by mass of all the constituents constituting the semiconductive ceramic member 10 can be determined on the basis of the sum of the obtained value in terms of $Al_2O_3$ and the obtained value in terms of $TiO_2$. The content of one of aluminum oxide and titanium oxide per 100% by mass of aluminum oxide and titanium oxide in total can be determined by calculating a percentage with either the obtained value in terms of $Al_2O_3$ or the obtained value in terms of $TiO_2$ as the numerator and the sum of the obtained value in terms of $Al_2O_3$ and the obtained value in terms of $TiO_2$ as the denominator, and the content of the other of aluminum oxide and titanium oxide can be determined by subtracting the determined content from 100.

Whether the peak of $TiO_x$ (0<x<2) is present within the binding energy range of 456 eV to 462 eV can be measured using the following method.

First of all, the semiconductive ceramic member 10 according to the present disclosure may be subjected to measurement using, as measurement equipment, for example, X-ray photoelectron spectroscopy (XPS) equipment (PHI Quantera SXM) manufactured by ULVAC-PHI, Inc. under the following conditions: monochromatic AlKα-rays obtained through a monochromator are used as X-rays to be applied; an X-ray output is 25 W, an acceleration voltage is 15 kV; a region to be measured in one measurement is a range of approximately 100 µm in diameter; the binding energy is counted in 0.100 eV increments; and the binding energy range for measurement is from 448 eV to 470 eV.

The semiconductive ceramic member 10 according to the present disclosure further contains silicon (Si). The content of silicon in terms of its oxide ($SiO_2$) in the first region 3 surrounded by two aluminum oxide crystal grains 1 and one titanium oxide crystal grain 2 (hereinbelow, merely referred to as the first region 3) is larger than the content of silicon in terms of its oxide ($SiO_2$) in the grain boundary 4 between the aluminum oxide crystal grains 1 and the titanium oxide crystal grains 2 (hereinbelow, merely referred to as the grain boundary 4).

In the semiconductive ceramic member 10 according to the present disclosure, current flows from one titanium oxide crystal grain 2 to another titanium oxide crystal grain 2 through the first region 3 and the grain boundary 4. At this time, a shorter current flowing path results in smaller variation in electrical resistance. The above structure makes the electrical resistance in the first region 3 higher than the electrical resistance in the grain boundary 4, which makes it difficult for current to flow to the first region 3 having a large volume. As a result, the current flowing path is shortened. Thus, the semiconductive ceramic member 10 according to the present disclosure has low electrical resistance and small variation in electrical resistance.

The variation in electrical resistance of the semiconductive ceramic member 10 according to the present disclosure may be measured using the following method. First of all, the semiconductive ceramic member 10 is divided into three or more samples. Subsequently, the volume resistivity of each sample is measured by the three-terminal method in conformity with JIS C 2141 (1992). Subsequently, the difference between a maximum value of the volume resistivity and a minimum value of the volume resistivity in each sample is calculated. Subsequently, the difference is divided by a mean value of the volume resistivity of each sample to obtain a value of the variation in electrical resistance.

The semiconductive ceramic member 10 according to the present disclosure may contain, for example, 0.02 parts by mass or more and 0.3 parts by mass or less of silicon in terms of its oxide per 100 parts by mass of aluminum oxide and titanium oxide in total.

In the semiconductive ceramic member 10 according to the present disclosure, the content of silicon in terms of its oxide in the first region 3 may be larger than the content of silicon in terms of its oxide in the grain boundary 4 by 0.5% by mass or more. Such a configuration increases the difference between the electrical resistance in the first region 3 and the electrical resistance in the grain boundary 4, which makes it more difficult for current to flow to the first region 3. Thus, the variation in electrical resistance of the semiconductive ceramic member 10 according to the present disclosure is further reduced.

For example, in the first region 3, the content of silicon in terms of its oxide may be 1% by mass or more and 6% by mass or less per 100% by mass of all the constituents constituting the first region 3. For example, in the first region 3, the total content of aluminum in terms of its oxide ($Al_2O_3$) and titanium in terms of its oxide ($TiO_2$) may be 70% by mass or more per 100% by mass of all the constituents constituting the first region 3.

For example, in the grain boundary 4, the content of silicon in terms of its oxide may be 2% by mass or less per 100% by mass of all the constituents constituting the grain boundary 4. For example, in the grain boundary 4, the total content of aluminum in terms of its oxide ($Al_2O_3$) and titanium in terms of its oxide ($TiO_2$) may be 70% by mass or more per 100% by mass of all the constituents constituting the grain boundary 4.

The semiconductive ceramic member 10 according to the present disclosure may further contain calcium (Ca). The content of calcium in terms of its oxide (CaO) in the first region 3 may be larger than the content of calcium in terms of its oxide (CaO) in the grain boundary 4.

Such a configuration makes the electrical resistance in the first region 3 further higher than the electrical resistance in the grain boundary 4, which makes it more difficult for current to flow to the first region 3. Thus, the variation in electrical resistance of the semiconductive ceramic member 10 according to the present disclosure is further reduced.

The semiconductive ceramic member 10 according to the present disclosure may contain, for example, 0.03 parts by mass or more and 0.2 parts by mass or less of calcium in terms of its oxide per 100 parts by mass of aluminum oxide and titanium oxide in total.

In the semiconductive ceramic member 10 according to the present disclosure, the content of calcium in terms of its oxide in the first region 3 may be larger than the content of calcium in terms of its oxide in the grain boundary 4 by 0.6% by mass or more.

Such a configuration increases the difference between the electrical resistance in the first region 3 and the electrical resistance in the grain boundary 4, which makes it more difficult for current to flow to the first region 3. Thus, the variation in electrical resistance of the semiconductive ceramic member 10 according to the present disclosure is further reduced.

For example, in the first region 3, the content of calcium in terms of its oxide may be 0.2% by mass or more and 3% by mass or less per 100% by mass of all the constituents constituting the first region 3.

For example, in the grain boundary 4, the content of calcium in terms of its oxide may be 0.6% by mass or less per 100% by mass of all the constituents constituting the grain boundary 4.

The content of each of the constituents constituting the first region 3 and the grain boundary 4 may be measured and calculated using the following method. First of all, the semiconductive ceramic member 10 according to the present disclosure is cut, and the cut surface is observed using a transmission electron microscope (TEM). Subsequently, it is determined whether a crystal grain is the aluminum oxide crystal grain 1 or the titanium oxide crystal grain 2 by means of electron beam diffraction using the TEM.

The crystal grain determination can also be performed using an energy dispersive X-ray spectrometer (EDS) attached to the TEM. For example, in quantitative composition analysis of crystal grains using the EDS, a crystal grain containing 90% by mass or more of aluminum (Al) and oxygen (O) in total is the aluminum oxide crystal grain 1. In quantitative composition analysis of crystal grains using the EDS, a crystal grain containing 90% by mass or more of titanium (Ti) and oxygen (O) in total is the titanium oxide crystal grain 2.

The quantitative analysis using the EDS may be performed on the first region 3 surrounded by two aluminum oxide crystal grains 1 and one titanium oxide crystal grain 2 and the grain boundary 4 between the aluminum oxide crystal grains 1 and the titanium oxide crystal grains 2. The total content of all the constituents measured by the quantitative analysis using the EDS may be taken as 100% by mass of all the constituents constituting the first region 3 or the grain boundary 4.

The first region 3 and the grain boundary 4 may contain zirconium (Zr). The content of zirconium in terms of its oxide in the first region 3 may be smaller than the content of zirconium in terms of its oxide in the grain boundary 4.

The semiconductive ceramic member 10 according to the present disclosure having the above configuration has small variation in electrical resistance.

Zirconium oxide is typically prone to oxygen vacancies. Electrical resistance tends to decrease with increase in oxygen vacancies. Thus, if the content of zirconium in the grain boundary 4 increases, oxygen vacancies in the grain boundary 4 increase, and the electrical resistance thus tends to decrease. On the other hand, if the content of zirconium in the first region 3 decreases, oxygen vacancies decrease, and the electrical resistance in the first region 3 thus tends to increase. Thus, the electrical resistance in the first region 3 becomes larger than the electrical resistance in the grain boundary 4, which makes it difficult for current to flow to the first region 3 having a large volume and makes it easy for current to flow to the grain boundary 4. As a result, the current flowing path is shortened. Thus, the semiconductive ceramic member 10 according to the present disclosure has small variation in the electrical resistance.

The content of zirconium in terms of its oxide in the first region 3 may be smaller than the content of zirconium in terms of its oxide in the grain boundary 4 by 0.3% by mass or more.

The semiconductive ceramic member 10 described above may be produced using, as raw materials, more fine $ZrO_2$ powder than coarse $ZrO_2$ powder. Even if the content of zirconium is constant, the content of zirconium in the grain boundary 4 tends to become larger than the content of zirconium in the first region 3 by increasing the proportion of fine $ZrO_2$ powder when both fine $ZrO_2$ powder and coarse $ZrO_2$ powder are used as the raw materials. In other words, the content of zirconium in the first region 3 tends to become smaller than the content of zirconium in the grain boundary 4. For example, the fine $ZrO_2$ powder may be powder having a particle size of 0.1 μm or more and 0.3 μm or less, the particle size being measured by means of laser diffraction when the cumulative volume proportion from a smaller particle reaches 50% by volume. The coarse $ZrO_2$ powder may be powder having a particle size of 0.8 μm or more and 2 μm or less, the particle size being measured in a similar manner.

The first region 3 and the grain boundary 4 may contain sodium (Na). The content of sodium in terms of its oxide in the first region 3 may be larger than the content of sodium in terms of its oxide in the grain boundary 4.

The semiconductive ceramic member 10 according to the present disclosure having the above configuration has small variation in electrical resistance.

In the presence of titanium, sodium ion conduction tends to be more suppressed as the Na content increases. Thus, in the presence of titanium, the electrical resistance tends to become higher as the Na content increases. Thus, since the Na content in the first region 3 is larger than the Na content in the grain boundary 4, the electrical resistance in the first region 3 tends to become higher than the electrical resistance in the grain boundary 4. This makes it difficult for current to flow to the first region 3 having a large volume and makes it easy for current to flow to the grain boundary 4. As a result, the current flowing path is shortened. Thus, the semiconductive ceramic member 10 according to the present disclosure has small variation in electrical resistance.

The content of sodium in terms of its oxide in the first region 3 may be larger than the content of sodium in terms of its oxide in the grain boundary 4 by 0.2% by mass or more.

The semiconductive ceramic member 10 described above may be produced using, as raw materials, more NaCl powder than $Na_2CO_3$ powder. Even if the content in terms of $Na_2O$ is constant, the proportion of sodium in the first region 3 tends to become larger than the proportion of sodium in the grain boundary 4 by making the proportion of NaCl powder larger than the proportion of $Na_2CO_3$ powder as the raw materials. The mol % of $Na_2CO_3$ and the mol % of NaCl may be compared to compare the proportion of $Na_2CO_3$ powder and the proportion of NaCl powder.

Then, an example of a method for manufacturing the semiconductive ceramic member according to the present disclosure will be described.

First of all, α-alumina (α-$Al_2O_3$) powder, rutile titanium dioxide ($TiO_2$) powder, silicon oxide ($SiO_2$) powder, and a colloidal silica solution having an average particle size within a range of 10 nm to 100 nm are prepared.

Subsequently, the α-alumina powder and the titanium dioxide ($TiO_2$) powder are weighted out such that the content of the α-alumina powder is 86% by mass or more and 96% by mass or less and the content of the titanium dioxide powder is 4% by mass or more and 14% by mass or less. Further, the silicon oxide powder and the colloidal silica solution are weighted out such that the content of silicon in terms of its oxide is 0.02 parts by mass or more and 0.3 parts by mass or less per 100 parts by mass of the α-alumina powder and the titanium dioxide powder in total.

The blending ratio of the silicon oxide powder and the colloidal silica solution is such that, per 100% by mass of the silicon oxide powder and silicon contained in the colloidal silica solution in terms of its oxide in total, the content of silicon contained in the colloidal silica solution in terms of its oxide is 2% by mass or more and the content of the silicon oxide powder is the rest percentage. With such blending ratio, more fine silicon particles contained in the colloidal silica solution tend to solid-dissolve in the first region than in the grain boundary. Thus, the content of silicon in terms of its oxide in the first region becomes larger than the content of silicon in terms of its oxide in the grain boundary.

If the blending is performed such that the content of silicon contained in the colloidal silica solution in terms of its oxide is 3% by mass or more per 100% by mass of the silicon oxide powder and silicon contained in the colloidal silica solution in terms of its oxide in total, the content of silicon in terms of its oxide in the first region is larger than the content of silicon in terms of its oxide in the grain boundary by 0.5% by mass or more.

Subsequently, the α-alumina powder, the titanium dioxide powder, the silicon oxide powder, and the colloidal silica solution (hereinbelow, these are also referred to as a mixture raw material), which have been weighted out, are put in a ball mill and pulverized until the average particle size becomes a predetermined size after further adding thereto 100 parts by mass or more and 200 parts by mass or less of water as a solvent and 0.02 parts by mass or more and 0.5 parts by mass or less of a dispersant per 100 parts by mass of the mixture raw material.

Subsequently, 4 parts by mass or more and 10 parts by mass or less, on a solid-content basis, of binders such as polyethylene glycol (PEG), polyvinyl alcohol (PVA), and acrylic resin are added thereto, and all the materials are mixed together to obtain a slurry. Subsequently, the obtained slurry is spray-dried using a spray dryer to obtain granules.

Subsequently, the obtained granules used as a molding raw material are shaped into a molded body having a desired shape by means of, for example, powder press molding or isostatic pressing, and the molded body is subjected to cutting as needed. Subsequently, the molded body is kept at a temperature of 1500° C. or more and 1600° C. or less for 2 hours or more and 12 hours or less in the aerial atmosphere to fire the molded body, thereby obtaining a sintered compact. The obtained sintered compact may be subjected to grinding as needed.

Subsequently, in a gas for reduction having a ratio between hydrogen and nitrogen of 1:3, the obtained sintered compact is kept at a temperature of 1300° C. or more and 1400° C. or less for 1 hour or more and 5 hours or less and further kept at a temperature of 1050° C. or more and 1150° C. or less for 1 hour or more and 30 hours or less, thereby performing reduction. Consequently, the peak of $TiO_x$ (0<x<2) is present within the binding energy range of 456 eV to 462 eV in XPS measurement, and the semiconductive ceramic member according to the present disclosure is thus obtained.

To achieve the configuration in which calcium is contained and the content of calcium in terms of its oxide in the first region is larger than the content of calcium in terms of its oxide in the grain boundary, the following procedure may be taken.

First of all, first calcium carbonate ($CaCO_3$) powder having an average particle size of 1 μm or more and 3 μm or less, and second calcium carbonate powder having an average particle size of 0.5 μm or less are prepared. Subsequently, the first calcium carbonate powder and the second calcium carbonate powder are weighted out and added to the mixture raw material such that the content of calcium in terms of its oxide is 0.03 parts by mass or more and 0.2 parts by mass or less per 100 parts by mass of the α-alumina powder and the titanium dioxide powder in total.

The blending ratio of the first calcium carbonate powder and the second calcium carbonate powder is such that, per 100% by mass of the first calcium carbonate powder and the second calcium carbonate powder in total, the content of the second calcium carbonate powder is 2% by mass or more and the content of the first calcium carbonate powder is the rest percentage. With such blending ratio, more second calcium carbonate fine powder solid-dissolves in the first region than in the grain boundary. Thus, the content of calcium in terms of its oxide in the first region becomes larger than the content of calcium in terms of its oxide in the grain boundary.

If the blending is performed such that the content of the second calcium carbonate powder is 3% by mass or more per 100% by mass of the first calcium carbonate powder and the second calcium carbonate powder in total, the content of calcium in terms of its oxide in the first region is larger than the content of calcium in terms of its oxide in the grain boundary by 0.6% by mass or more.

Hereinbelow, examples of the present disclosure will be specifically described. However, the present disclosure is not limited to the following examples.

Example 1

Samples that differ in the content of silicon in terms of its oxide in the first region and the grain boundary were produced, and variation in electrical resistance was evaluated.

First of all, α-alumina powder having an average particle size of 3 μm, rutile titanium dioxide powder having an average particle size of 3 silicon oxide powder having an average particle size of 2 and a colloidal silica solution having an average particle size of 20 nm, the average particle sizes being measured by means of laser diffraction and scattering, were prepared.

Subsequently, the α-alumina powder and the titanium dioxide powder were weighted out such that the content of the α-alumina powder is 91% by mass and the content of the titanium dioxide powder is 9% by mass. Further, the silicon oxide powder and the colloidal silica solution were weighted out such that the content of silicon in terms of its oxide has a value as shown in Table 1 per 100% by mass of the α-alumina powder and the titanium dioxide powder in total. At this time, the blending ratio of the silicon oxide powder and the colloidal silica solution was such that, per 100% by mass of the silicon oxide powder and silicon contained in the colloidal silica solution in terms of its oxide in total, the content of silicon contained in the colloidal silica solution in terms of its oxide has a value in Table 1. Subsequently, these materials were mixed together to obtain a mixture raw material.

Subsequently, the mixture raw material was pulverized in a ball mill until the average particle size became a predetermined size after adding thereto 150 parts by mass of water and 0.05 parts by mass of a dispersant per 100 parts by mass of the mixture raw material. Subsequently, 6 parts by mass, on a solid-content basis, of PEG, PVA, and acrylic resin in total were added thereto, and all the materials were mixed together to obtain a slurry. Subsequently, the obtained slurry was spray-dried using a spray dryer to obtain granules.

Subsequently, the obtained granules used as a molding raw material were shaped into a molded body having a shape of 130 mm×130 mm×12 mm by means of powder press molding. Subsequently, the molded body was kept at a temperature of 1550° C. for 5 hours in the aerial atmosphere to fire the molded body, thereby obtaining a sintered compact. Subsequently, the obtained sintered compact was subjected to cutting to obtain a cut body having a shape of 100 mm×100 mm×3 mm.

Subsequently, in a gas for reduction having a ratio between hydrogen and nitrogen of 1:3, the cut body was kept at a temperature of 1380° C. for 3 hours and further kept at a temperature of 1100° C. for 12 hours, thereby performing reduction to obtain each sample.

Then, each sample was subjected to measurement using XPS equipment manufactured by ULVAC-PHI, Inc. under the following conditions: monochromatic AlKα-rays obtained through a monochromator are used as X-rays to be applied; an X-ray output is 25 W, an acceleration voltage is 15 kV; a region to be measured in one measurement is a range of approximately 100 μm in diameter; the binding energy is counted in 0.100 eV increments; and the binding energy range for measurement is from 448 eV to 470 eV. The result shows that, in each sample, the peak of $TiO_x$ $(0<x<2)$ was present within the binding energy range of 456 eV to 462 eV.

Then, each sample was subjected to quantitative analysis using an EDS attached to the TEM, the analysis being performed on a first region surrounded by two aluminum oxide crystal grains and one titanium oxide crystal grain and a grain boundary between aluminum oxide crystal grains and titanium oxide crystal grains.

Then, the electrical resistance and variation in electrical resistance of each sample were measured. First of all, each sample was divided into four measurement samples each having a size of approximately 50 mm×50 mm×3 mm. Subsequently, the volume resistivity of each measurement sample was measured by the three-terminal method in conformity with JIS C 2141 (1992) using ultrahigh insulation resistance meter 8340A manufactured by ADC CORPORATION. Subsequently, a mean value R, a maximum value, and a minimum value of the volume resistivity of each measurement sample were obtained. Subsequently, the maximum value–the minimum value (referred to as ΔR) was calculated. Subsequently, ΔR was divided by the mean value R to calculate variation ΔR/R in electrical resistance. The mean value R of the volume resistivity of each measurement sample was $10^3$ Ω·cm or more and $10^{10}$ Ω·cm or less.

The result is illustrated in Table 1.

TABLE 1

| | Mixture Raw Material | | Content of Silicon in Terms of its Oxide (% by Mass) | | | |
|---|---|---|---|---|---|---|
| No. | Content of Silicon in Terms of its Oxide (Part by Mass) | Colloidal Silica Solution (% by Mass) | Grain Boundary Phase | First Region | First Region-Grain Boundary Phase | ΔR/R |
| 1 | 0.03 | 0 | 0.4 | 0.4 | 0 | 0.40 |
| 2 | 0.02 | 3 | 0.4 | 0.8 | 0.4 | 0.28 |
| 3 | 0.01 | 3 | 0.1 | 0.6 | 0.5 | 0.26 |
| 4 | 0.02 | 10 | 0.3 | 1.4 | 1.1 | 0.23 |
| 5 | 0.06 | 20 | 1 | 3.4 | 2.4 | 0.20 |
| 6 | 0.08 | 20 | 1.2 | 4.6 | 3.4 | 0.20 |
| 7 | 0.2 | 20 | 1.6 | 5.6 | 4 | 0.22 |
| 8 | 0.3 | 20 | 1.9 | 6.1 | 4.2 | 0.22 |

As illustrated in Table 1, the variation in electrical resistance of each of Samples Nos. 2 to 8 is 0.28 or less, which is smaller than that of Sample No. 1. This shows that, if the content of silicon in terms of its oxide in the first region is larger than the content of silicon in terms of its oxide in the grain boundary, the variation in electrical resistance is small.

Among Samples Nos. 2 to 8, the variation in electrical resistance of each of Samples Nos. 3 to 8 is 0.26 or less and thus small. This shows that, if the content of silicon in terms of its oxide in the first region is larger than the content of silicon in terms of its oxide in the grain boundary by 0.5% by mass or more, the variation in electrical resistance further decreases.

Example 2

Samples that differ in the content of calcium in terms of its oxide in the first region and the grain boundary were produced, and variation in electrical resistance was evaluated.

Each sample was produced in the same method as that used to produce Sample No. 3 in Example 1 except that first calcium carbonate powder having an average particle size of 2 and second calcium carbonate powder having an average particle size of 0.2 μm were prepared, and the first calcium carbonate powder and the second calcium carbonate powder were weighted out and added to the mixture raw material such that the content of calcium in terms of its oxide has a value shown in Table 2 and the content of the second calcium carbonate powder has a value shown in Table 2 per 100 parts by mass of the α-alumina powder and the titanium dioxide powder in total. Sample No. 3 in Example 1 is described as Sample No. 9 in Table 2.

Then, check of constituents in the first region and the grain boundary and measurement of variation in electrical resistance were performed on each sample in the same method as that in Example 1.

The result is illustrated in Table 2.

TABLE 2

| | Mixture Raw Material | | Content of Calcium in Terms of its Oxide (% by Mass) | | | |
| --- | --- | --- | --- | --- | --- | --- |
| No. | Content of Calcium in Terms of its Oxide (Part by Mass) | Second Calcium Carbonate Powder (% by Mass) | Grain Boundary Phase | First Region | First Region-Grain Boundary Phase | ΔR/R |
| 9 | 0 | 0 | 0 | 0 | 0 | 0.26 |
| 10 | 0.02 | 0 | 0.3 | 0.3 | 0 | 0.26 |
| 11 | 0.02 | 1 | 0.2 | 0.6 | 0.4 | 0.23 |
| 12 | 0.02 | 2 | 0.1 | 0.7 | 0.6 | 0.18 |
| 13 | 0.04 | 3 | 0.3 | 0.9 | 0.6 | 0.18 |
| 14 | 0.04 | 5 | 0.3 | 1.1 | 0.8 | 0.18 |
| 15 | 0.1 | 5 | 0.6 | 2 | 1.4 | 0.15 |
| 16 | 0.1 | 10 | 0.5 | 2.4 | 1.9 | 0.15 |
| 17 | 0.2 | 12 | 1 | 3.3 | 2.3 | 0.15 |

As illustrated in Table 2, the variation in electrical resistance of each of Samples Nos. 11 to 17 is 0.23 or less and thus small. This shows that, if the content of calcium in terms of its oxide in the first region is larger than the content of calcium in terms of its oxide in the grain boundary, the variation in electrical resistance further decreases.

Among Samples Nos. 11 to 17, the variation in electrical resistance of each of Samples Nos. 12 to 17 is 0.18 or less and thus small. This shows that, if the content of calcium in terms of its oxide in the first region is larger than the content of calcium in terms of its oxide in the grain boundary by 0.6% by mass or more, the variation in electrical resistance further decreases.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A semiconductive ceramic member comprising: a plurality of aluminum oxide crystal grains; and a plurality of titanium oxide crystal grains, wherein
a total content of aluminum oxide and titanium oxide is 99% by mass or more per 100% by mass of all constituents,
a content of the aluminum oxide is 86% by mass or more and 96% by mass or less and a content of the titanium oxide is 4% by mass or more and 14% by mass or less per 100% by mass of the aluminum oxide and the titanium oxide in total,
a peak of $TiO_x$ ($0<x<2$) is present within a binding energy range of 456 eV to 462 eV in X-ray photoelectron spectroscopy measurement,
the semiconductive ceramic member further comprises silicon, and
a content of the silicon in terms of its oxide in a first region surrounded by two of the aluminum oxide crystal grains and one of the titanium oxide crystal grains is larger than a content of the silicon in terms of its oxide in a grain boundary between the aluminum oxide crystal grains and the titanium oxide crystal grains.

2. The semiconductive ceramic member according to claim 1, wherein the content of the silicon in terms of its oxide in the first region is larger than the content of the silicon in terms of its oxide in the grain boundary by 0.5% by mass or more.

3. The semiconductive ceramic member according to claim 1, further comprising
calcium, wherein
a content of the calcium in terms of its oxide in the first region is larger than a content of the calcium in terms of its oxide in the grain boundary.

4. The semiconductive ceramic member according to claim 3, wherein the content of the calcium in terms of its oxide in the first region is larger than the content of the calcium in terms of its oxide in the grain boundary by 0.6% by mass or more.

5. The semiconductive ceramic member according to claim 1, wherein a content of zirconium in terms of its oxide in the first region is smaller than a content of zirconium in terms of its oxide in the grain boundary.

6. The semiconductive ceramic member according to claim 1, wherein a content of sodium in terms of its oxide in the first region is larger than a content of sodium in terms of its oxide in the grain boundary.

* * * * *